US010704334B2

(12) United States Patent
Jiang

(10) Patent No.: US 10,704,334 B2
(45) Date of Patent: Jul. 7, 2020

(54) POLYCRYSTALLINE DIAMOND COMPACT CUTTERS HAVING PROTECTIVE BARRIER COATINGS

(71) Applicant: Wenhui Jiang, Pearland, TX (US)

(72) Inventor: Wenhui Jiang, Pearland, TX (US)

( * ) Notice: Subject to any disclaimer, the term of this patent is extended or adjusted under 35 U.S.C. 154(b) by 162 days.

(21) Appl. No.: 15/978,031

(22) Filed: May 11, 2018

(65) Prior Publication Data

US 2018/0371845 A1 Dec. 27, 2018

Related U.S. Application Data

(60) Provisional application No. 62/524,525, filed on Jun. 24, 2017.

(51) Int. Cl.
*E21B 10/567* (2006.01)
*C23C 14/18* (2006.01)
*C23C 14/06* (2006.01)
*C23C 14/02* (2006.01)
C22C 26/00 (2006.01)

(52) U.S. Cl.
CPC .......... *E21B 10/567* (2013.01); *C23C 14/024* (2013.01); *C23C 14/0635* (2013.01); *C23C 14/0641* (2013.01); *C23C 14/18* (2013.01); C22C 26/00 (2013.01)

(58) Field of Classification Search
CPC . E21B 10/567; C23C 14/024; C23C 14/0641; C23C 14/0635; C23C 14/18; C23C 28/34; C23C 28/322; C23C 14/32
See application file for complete search history.

(56) References Cited

U.S. PATENT DOCUMENTS

| 3,356,473 A | 12/1967 | Hull et al. |
| 3,650,714 A | 3/1972 | Farkas |
| 3,929,432 A | 12/1975 | Caveney |
| 3,957,461 A | 5/1976 | Lindstrom et al. |
| 3,984,214 A | 10/1976 | Pratt et al. |
| 4,399,167 A | 8/1983 | Pipkin |
| 4,605,343 A | 8/1986 | Hibbs et al. |
| 4,738,689 A | 4/1988 | Gigl et al. |

(Continued)

FOREIGN PATENT DOCUMENTS

EP 0328583 B1 8/1995

*Primary Examiner* — Michael C Zarroli

(57) ABSTRACT

The present disclosure relates to a polycrystalline diamond compact (PDC) cutter with protective barrier coating. The PDC cutter consists of an unleached or leached polycrystalline diamond (PCD) table, a cemented carbide body substrate, and a coating disposed on the cutter. The coating covers at least partially the exterior surfaces of the PCD table of the PDC cutter, and it may also extend over partially or entirely the exterior surfaces of the cemented carbide body. The coating is either a single layer or multilayer. The coating has a thickness of 0.4 µm-100 µm. The coating may have a strong metallurgical bonding with PDC cutter. The coating comprises an oxidation-resistant layer that protects the PDC cutter from thermal and mechanical degeneration during brazing and cutting applications. Methods for preparing such the coating comprise physical vapor deposition, chemical vapor deposition, thermoreactive deposition and diffusion, electrical plating, electroless plating, or their combinations.

20 Claims, 13 Drawing Sheets

(56) References Cited

U.S. PATENT DOCUMENTS

| | | |
|---|---|---|
| 5,024,680 A | 6/1991 | Chen et al. |
| 5,049,164 A | 9/1991 | Horton et al. |
| 5,151,107 A * | 9/1992 | Cho .................. C22C 26/00 |
| | | 51/295 |
| 5,529,805 A | 6/1996 | Iacovangelo et al. |
| 5,626,909 A | 5/1997 | Iacovangelo |
| 5,833,021 A | 11/1998 | Mensa-Wilmot et al. |
| 6,592,985 B2 | 7/2003 | Grinffin et al. |
| 6,663,682 B2 | 12/2003 | Baldoni et al. |
| 6,878,447 B2 | 4/2005 | Grinffin et al. |
| 8,168,115 B2 * | 5/2012 | Qian .................. B24D 3/10 |
| | | 264/642 |
| 8,414,986 B2 | 4/2013 | Keshavan |
| 8,951,317 B1 * | 2/2015 | Mukhopadhyay ...... E21B 10/46 |
| | | 51/295 |
| 9,061,264 B2 * | 6/2015 | Frushour .................. B01J 3/062 |
| 9,945,185 B2 * | 4/2018 | Bird .................. B24D 18/0009 |
| 10,041,304 B2 * | 8/2018 | Saini .................. B24D 18/0009 |
| 10,167,674 B2 * | 1/2019 | Khabashesku ........ E21B 10/567 |
| 2010/0206941 A1 | 8/2010 | Egan et al. |
| 2012/0103697 A1 | 5/2012 | DiGiovanni |
| 2012/0114442 A1 | 5/2012 | Johansson et al. |
| 2013/0287507 A1 | 10/2013 | Lind et al. |

* cited by examiner

POLYCRYSTALLINE DIAMOND COMPACT CUTTERS HAVING PROTECTIVE BARRIER COATINGS

CROSS-REFERENCE TO RELATED APPLICATION

This application claims the benefit of U.S. Provisional Patent Application Ser. No. 62/524,525, filed on Jun. 24, 2017, titled "Polycrystalline Diamond Compact Cutters Having Protective Barrier Coatings," the disclosure of which is incorporated herein in its entirety by this reference. This application is also related to application Ser. No. 15/421,082, which was filed on Jan. 31, 2017, and was canceled, the contents of which are incorporated herein in their entirety.

BACKGROUND OF THE INVENTION—PRIOR ART

The following is a tabulation of some prior arts that presently appear relevant:

U.S. Patents

| Pat. No. | Kind Code | Issue Date | Patentee |
| --- | --- | --- | --- |
| 3,356,473 | A | 1967 Dec. 5 | Hull et al. |
| 3,650,714 | A | 1972 Mar. 21 | Farkas |
| 3,957,461 | A | 1976 May 18 | Lindstrom et al. |
| 3,929,432 | A | 1975 Dec. 30 | Caveney |
| 3,984,214 | A | 1976 Oct. 5 | Pratt et al. |
| 6,663,682 | B2 | 2003 Dec. 16 | Baldoni et al. |
| 4,399,167 | A | 1983 Aug. 16 | Pipkin |
| 5,024,680 | A | 1991 Jun. 18 | Chen et al. |
| 5,049,164 | A | 1991 Sep. 17 | Horton et al. |
| 4,738,689 | A | 1988 Apr. 19 | Gigl et al. |
| 5,529,805 | A | 1996 Jun. 25 | Iacovangelo et al. |
| 5,626,909 | A | 1997 May 6 | Iacovangelo |
| 4,605,343 | A | 1986 Aug. 12 | Hibbs et al. |
| 5,833,021 | A | 1998 Nov. 10 | Mensa-Wilmot et al. |
| 8,414,986 | B2 | 2013 Apr. 9 | Keshavan |
| 6,592,985 | B2 | 2003 Jul. 15 | Griffin et al. |
| 6,878,447 | B2 | 2005 Apr. 12 | Griffin et al. |

U.S. Patent Application Publications

| Publication Nr. | Kind Code | Publication Date | Applicant |
| --- | --- | --- | --- |
| 20100206941 | A1 | 2010 Aug. 19 | Egan et al. |
| 20120114442 | A1 | 2012 May 10 | Johansson et al. |
| 20130287507 | A1 | 2013 Oct. 31 | Lind et al. |
| 20120103697 | A1 | 2012 May 3 | DiGiovanni |

Foreign Patent Documents

| Foreign Doc. Nr | Country Code | Kind Code | Publication Date | Patentee |
| --- | --- | --- | --- | --- |
| 0328583 | EP | B1 | 1995 Aug. 30 | Chen et al. |

The present disclosure relates to polycrystalline diamond compact (PDC) cutters used in various cutting, grinding, as well as drilling tools such as drill bits, mill bits (heads), and reamers for earth exploration and production. More specifically, the present disclosure relates to protective barrier coatings which are applied to the polycrystalline diamond (PCD) layer surfaces of the PDC cutters to protect the PCD layer from thermal damages during brazing operations and cutting applications, so as to enhance the cutter's performance and operating life.

PDC cutters are well known in prior arts. They comprise a layer or "table" of PCD materials as a cutting element and a cemented carbide material body as a cutter substrate. They are typically cylindrical in shape. The PDC cutters are formed by sintering and bonding together relatively small diamond grains under conditions of high temperature and high pressure in the presence of a catalyst (for example, cobalt, nickel, iron, or alloys or mixtures thereof) to form a table of PCD materials on a cutter substrate. These processes are often referred to as high-temperature/high-pressure (HTHP) processes. The cutter substrate may comprise a cemented carbide material such as cobalt-sintered tungsten carbide. In such the instances, cobalt (or other catalyst material) in the cutter substrate may diffuse into the diamond grains during sintering and serve as the catalyst material for forming intergranular diamond-to-diamond bonds, and the resulting diamond table, from the diamond grains. In other methods, powdered catalyst materials may be mixed with the diamond grains prior to sintering the grains together in an HTHP process.

Alternatively, a PDC cutter can be formed by brazing an unbacked PCD block onto a cemented carbide material substrate. The unbacked PCD block can be formed by sintering individual diamond particles together in an HTHP process in the presence of catalyst materials that promote the intergranular diamond-to-diamond bonds, as described previously.

Thermally stable polycrystalline diamond compact (TSPDC) cutters refer herein to the PDC cutters that have a thermally stable PCD table that contains none or a reduced amount of catalyst materials such as cobalt. Usually, a leaching process is used to remove the catalyst materials in a PCD using an acid solution. The leaching process may be performed on a PCD table of a PDC cutter or on an unbacked PCD block formed by HTHP. For the latter, the leached unbacked PCD block may be subsequently brazed to a cemented carbide substrate forming a TSPDC cutter. Removal of catalyst materials such as cobalt would improve thermal resistance of a PDC cutter substantially, as the catalyst materials would favor graphitization of diamond and develop thermal stresses due to significant difference in thermal expansion coefficient between them and diamond. Usually, leaching a PDC cutter is just to remove catalyst materials around a surface and subsurface layer of a PCD table, that is, partial leaching, while the rest unleached volume of the PCD table remains intact, which keeps a good toughness of the PDC cutter. A leaching depth is generally tens to hundreds of micrometers from the exterior surfaces of a PCD table.

It is a common practice to braze PDC cutters as cutting elements onto various drilling tools such as drill bits, mill bits (heads), reamers, etc. But, the PDC cutters have poor brazing capability and the bonding strengths are low. In addition, tungsten carbide (in a sintered tungsten carbide substrate), diamond (in a PCD table), and cobalt (in both sintered tungsten carbide substrate and PCD table) in the PDC cutters tend to be oxidized and degrade during brazing operations. During their cutting applications, the PDC cutters experience localized high temperatures at their cutting edges where significant amount of friction heat is generated. Especially, diamond is vulnerable in air or an oxygen containing environment at high temperatures, and it tends to be oxidized and graphitize. As a result, the PDC cutters may suffer thermal damages, resulting in their premature failure.

Although PDC cutters are very successful as a cutting element in drilling tools for earth exploration and production, their premature failure still affects performance and efficiency of drilling tools. The protection of the PDC cutters from thermal damages during brazing and cutting applications is still in need.

In fact, it has been recognized that diamond particles degrade and lose during brazing operations and cutting applications when they are embedded in grinding, abrading, or cutting sections of various tools. These problems are commonly addressed by coating the diamond particles with metals or alloys that bond chemically to the particles, and alloy to the bond matrix. Various coatings of metals and alloys in a single layer or multilayer on the diamond particles are developed to enhance bond retention, improve high-temperature oxidation resistance, suppress high-temperature graphitization, and like benefits. Such the coatings are especially useful when fine-grain diamond grits are employed in the various tools. Typical arts in this single diamond grain coating endeavor include U.S. Pat. Nos. 3,356,473 A, 3,650,714 A, 3,957,461 A, 3,929,432 A, 3,984,214 A, 6,663,682 B2, 4,399,167 A, 5,024,680 A, and U.S. Appl. Pat. No. 2010/0,206,941 A1.

Application of coating onto PCD materials and PDC cutters also receives attentions. It is an effective approach for improving processing capabilities and properties of the PCD materials and the PDC cutters. Various coatings of metals, alloys, and compounds are developed for them in prior arts.

Metallic coatings on PCD materials are for improving their brazing capabilities. U.S. Pat. No. 5,049,164 A discloses PCD materials and diamond crystals with multilayer metal coatings for bonding them to a matrix, which comprise a first metal layer of a refractory metal, such as tungsten, a compliant metal layer of copper, and an outer metal layer of a refractory metal such as tungsten, to prevent thermal stress from damaging PCD or diamond. Metallic bonding layers of a metal, such as nickel, are placed between the tungsten and copper layers for improved bonding. The method of manufacturing multilayer metal coatings comprises applying the inner metal layer by chemical vapor deposition (CVD), applying the first bonding layer metal by electrolytic deposition, applying the compliant layer metal by electrolytic deposition, applying the second bonding layer by electrolytic deposition and applying the outer layer by chemical vapor deposition. A superabrasive tool element comprises a coated diamond product bonded either to a matrix comprising tungsten carbide or iron powder or to a cemented tungsten carbide support.

European Pat. No. 0,328,583 B1 relates to a thermally stable PCD (TSPCD) having a metal coating for improving brazing capability and enhancing its bonding strength to a support structure such as a drill bit, wherein the TSPCD refers to as a leached PCD. The TSPCD has a double layer coating including an outer metal portion chemically bonded to a support by means of a metallurgical bond and an inner carbide portion chemically bonded to the diamond element by an atom to atom bond between the carbon of the diamond and the carbide layer. The double layer coating consists of tungsten/titanium, tungsten/chromium or nickel/titanium. The coating has a thickness of 10 μm-30 μm, which is obtained by CVD or fused salt deposition. The coating covers at least the surfaces in contact with the matrix.

Metallic coatings on PCD materials are also for protecting them from oxidation during brazing operations. U.S. Pat. No. 4,738,689 A discloses a coating on porous self-bonded polycrystalline diamond compacts, hereinafter termed "porous PCD", to improve their oxidation resistance. The porous PCD has a network of interconnected empty pores dispersed throughout, and contains less than about 3% non-diamond phase. It is a kind of TSPCD. All the exterior surfaces of the porous PCD is enveloped with a continuous coating which is effective under metal bond fabrication conditions, so that oxidation of the diamond in the compact does not exceed a threshold level whereat loss of diamond properties of the compact occurs. Metal bond fabrication conditions comprehend an atmosphere containing oxygen or water vapor. Metal coatings are preferred, especially in coating thicknesses in excess of about 8 μm, and applied by a CVD process. The metal coating is selected from the group consisting of nickel, copper, titanium, iron, cobalt, chromium, tantalum, tungsten, niobium, zirconium, vanadium, molybdenum, and alloys, compounds, as well as mixtures including titanium nitride or titanium carbide.

U.S. Pat. Nos. 5,529,805 A and 5,626,909 A disclose a multilayer coating on unbacked tool compacts including PCD and polycrystalline cubic boron nitride (PCBN), which comprises a metal bonding layer and a protective layer, so as to enable the compacts to be brazed in an air environment to a tool support. The metal bonding layer comprises chromium or tungsten-titanium alloys, while the protective layer is selected from silver, copper, gold, palladium, platinum, nickel, and their alloys. Furthermore, the invention teaches heating the metal bonding layer to form carbide or nitride at the interface between the coating and the compact, and heating the protective layer to provide adhesion of the protective layer to the bonding layer.

As described above, the metallic coatings are applied to PCD mainly for improving its brazing capability. The PCD is freestanding without a supporting substrate of a cemented carbide material, whose brazing capability is notorious. In contrast, metals and alloys generally have an excellent brazing and welding capability, as they have an excellent wettability to brazing alloys. A metal/alloy coating on the PCD would improve its brazing capability.

Thick metallic coatings on PDC cutters are used for dissipating heat during cutting application that would cause thermal damages of the PDC cutters, as a metal or alloy is a good heat conductor. U.S. Pat. No. 4,605,343 A discloses an improved PDC cutter with a cemented carbide substrate, which has a metallic heat sink layer with a thickness of between about 0.01 and 0.1 inches (0.254-2.54 mm) (thick coating) covering at least the outer diamond surfaces of the diamond layer. The heat sink layer is selected from the group consisting of copper, tungsten alloyed with cobalt, nickel, iron, and nickel phosphorus alloys. The heat sink layer is bonded to the diamond surfaces via a bonding medium comprising at least one intermediate layer of metal selected from the group consisting of molybdenum, tungsten, titanium, zirconium, and chromium. The heat sink layer is used to dissipate heat generated during cutting.

Compound coatings on PDC cutters are for improving mechanical properties such as toughness and/or wear resistance. U.S. Pat. No. 5,833,021 A discloses a surface enhanced PDC cutter having a coating refractory material to increase operational life. The coating typically has a thickness in the range of between 0.1 μm and 30 μm and may be made from titanium nitride, titanium carbide, titanium aluminum nitride, boron carbide, zirconium carbide, chromium carbide, chromium nitride, or any of the transition metals or Group IV metals combined with either silicon, aluminum, boron, carbon, nitrogen, or oxygen. The coating can be applied using conventional plating or other physical or chemical deposition techniques. The coating is applied only to the cutting face of inserts to be brazed into a bit body to avoid interference of brazing by the coating which may not be wetted by some brazing alloys. The test results indicate that 2 µm thick TiN coating on a PCD table of a PDC cutter increased its cutting capability by 15%.

U.S. Pat. No. 8,414,986 B2 discloses a method of coating a cutting element with refractory materials and diamond-like carbon (DLC). The cutting element is either PDC or PCBN. Plasma enhanced chemical vapor deposition (PECVD) is utilized. Its relatively low processing temperature would benefit to keep integrity of PDC cutters, avoiding any thermal damages during coating.

U.S. Appl. Pat. Nos. 2012/0,114,442 A1 and 2013/0,287,507 A1 disclose a cutting tool insert comprising a body of cemented carbide, cermet, ceramics, high speed steel, PCD or PCBN, and a hard and wear resistant coating. The coating compounds are zirconium aluminum nitride and a NaCl-structured complex metallic compound, respectively. The coatings have a thickness of between 0.5 µm and 10 µm which is applied by PVD for metal cutting application generating high temperatures.

U.S. Appl. Pat. No. 2012/0,103,697 A1 discloses an earth-boring tool PCD insert of having a protective coating disposed over the insert. The coating comprises a ceramic comprising boron, aluminum, and magnesium. The ceramic of boron, aluminum, and magnesium has a low coefficient of friction and a high hardness.

Refractory compounds such as carbide and nitrides have a high hardness and good wear resistance. But, bonding of the compound coating with the PCD and its cutter may not be metallurgical, and thus, its bonding strength is limited.

The present disclosure has a primary objective that protective coatings with excellent oxidation resistance are applied onto PDC cutters to protect them from thermal damages during brazing operations and cutting applications such as oxidation and graphitization of diamond, so as to prolong their service life. In the meantime, a strong metallurgical bonding between the coating and the PDC cutters may be developed by a carbide-forming metal layer. The excellent oxidation resistance of the coatings and their strong bonding with the PDC cutters can guarantee the coatings to remain a longer time to protect the PDC cutters during brazing operations and especially, cutting applications.

SUMMARY OF THE INVENTION

The present disclosure relates to a polycrystalline diamond compact (PDC) cutter with protective barrier coating. The PDC cutter consists of an unleached or leached PCD table, a cemented carbide body substrate, and a coating disposed on the cutter. The leached PCD table, i.e., thermally stable polycrystalline diamond (TSPCD) table, has a plurality of pores at the surface and subsurface layer, which are generated by a leaching process. The coating covers at least partially the exterior surfaces of the PCD table of the PDC cutter, and it may also extend over partially or entirely the exterior surfaces of the cemented carbide body. The coating is either a single layer or multilayer. The coating has a thickness of 0.4 µm-100 µm, preferentially 1 µm-20 µm. Methods for preparing such the coating comprise physical vapor deposition (PVD), chemical vapor deposition (CVD), thermoreactive deposition and diffusion (TD), electrical plating, electroless plating, or their combinations.

An unleached or a leached PDC cutter has a coating comprising a layer of a carbide-forming metal selected from Ti, Nb, Zr, V, Ta, Hf, Cr, W, Mo, or the alloys containing any of these metals which is held in contact with the PDC cutter as a base layer, and an oxidation-resistant layer. The oxidation-resistant layer is a layer of a compound selected from carbides, nitrides, borides, oxides, or their complex compounds which is disposed over the base layer. The coating may have a metallurgical bonding with the PDC cutter. The oxidation-resistant layer may be a layer of a metal selected from Ni, Fe, Co, Ti, Nb, Zr, V, Ta, Hf, Cr, W, Mo, Mn, Ag, Cu, Au, Pt, Pd, or the alloys containing at least one of these metals.

An unleached or a leached PDC cutter has a coating comprising a layer of a compound selected from carbides, nitrides, borides, oxides, or their complex compounds which is held in contact with the PDC cutter. The coating has a metallurgical bonding with the PDC cutter.

The carbides, nitrides, borides, oxides, or their complex compounds are preferentially a compound containing aluminum, chromium, or both, such as AN, CrN, AlTiN, AlCrN, AlTiSiN, or TiAlCrYN, etc.

The metallurgical bonding between coatings and PDC cutters is developed during deposition processes, heat treatments, or brazing operations when mounting them to a tool, which is characterized by formation of a compound containing carbon from cutter surface at their interface. The heat treatments at between 450° C. and 900° C. for 1 minute-120 minutes may be utilized for generating the metallurgical bonding.

Alternatively, an outermost metallic layer may be applied to a previously deposited compound coating, which is selected from Ni, Fe, Co, Ti, Nb, Zr, V, Ta, Hf, Cr, W, Mo, Mn, Ag, Cu, Au, Pt, Pd, or the alloys containing at least one of these metals.

The coating processes comprise various deposition methods such as PVD, CVD, TD, electrolytic plating, electroless plating, or their combinations.

A method of coating a leached PDC cutter, i.e., a TSPDC cutter, comprises PVD including thermal evaporation, sputtering, and ion plating with a single layer or multilayer of metals/alloys, compounds, or both. The deposited metals/alloys are selected from Ni, Fe, Co, Ti, Nb, Zr, V, Ta, Hf, Cr, W, Mo, Mn, Ag, Cu, Au, Pt, Pd, or the alloys containing any of these metals and the deposited compounds are selected from carbides, nitrides, borides, oxides, or their complex compounds.

DRAWING—REFERENCE NUMERALS

Figure 1A:
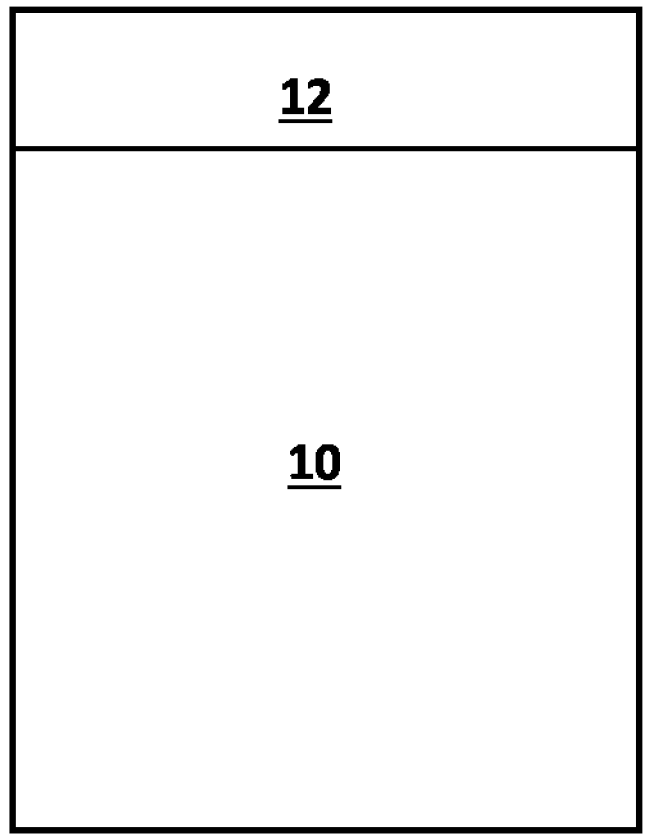
FIG. 1A is a schematic illustration of a cross sectional view of a cylindrical, unleached, conventional PDC cutter comprising a PCD table and a cemented carbide body substrate.

10 cemented carbide body substrate
12 unleached, conventional PCD table
14 partially leached PCD table
16 leached volume in partially leached PCD table
18 unleached volume in partially leached PCD table
20 coating layer of a carbide-forming metal/alloy
22 formed carbide particles
24 formed carbide layer
26 coating layer of an oxidation- and wear-resistant compound
28 coating layer of an oxidation-resistant metal/alloy

DETAILED DESCRIPTION OF THE INVENTION

Embodiments of the disclosure relate to polycrystalline diamond compact (PDC) cutter having a protective barrier coating. The PDC cutter comprises a layer or "table" of polycrystalline diamond (PCD) materials as a cutting element and a cemented carbide body as a cutter substrate. The PDC cutter is formed by sintering and bonding together relatively small diamond grains under conditions of high temperature and high pressure (HTHP) in the presence of a catalyst to form a table of polycrystalline diamond materials on a cutter substrate. The cutter substrate may comprise a cemented carbide material such as cobalt-sintered tungsten carbide. In such the instances, the cobalt (or other catalyst material) in the cutter substrate may diffuse into the diamond grain compacts during sintering and serve as the catalyst material for forming the inter-granular diamond-to-diamond bonds, and the resulting PCD table, from the diamond grains. In other methods, powdered catalyst material may be mixed with the diamond grains prior to sintering the grains together in an HTHP process. Alternatively, a PDC cutter can be formed by brazing an unbacked PCD table onto a cemented material substrate. The unbacked PCD can be formed by sintering individual diamond particles together in an HTHP process in the presence of a catalyst that promotes diamond-diamond bonding, as described previously.

According to this disclosure, a PDC cutter is an unleached PDC cutter. The unleached PDC cutter refers to a conventional PDC cutter whose PCD table comprises inter-bonded diamond grains and catalytic materials such as cobalt dispersed among interstitial spaces between the inter-bonded diamond grain. Its thermal stability is usually not higher than 750° C. FIG. 1A schematically shows a cross sectional view of an unleached PDC cutter. The PDC cutter consists of a cemented carbide body 10 as a supporting substrate and an unleached PCD table 12 as a cutting element, such as those discussed above. The unleached PCD table 12 consists of inter-bonded diamond grains and catalytic materials dispersed among interstitial spaces between the inter-bonded diamond grain. The cemented carbide body 10 consists of carbide and metallic binder.

According to this disclosure, a PDC cutter is a leached PDC cutter. The leached PDC cutter refers to a kind of thermally stable PDC (TSPDC) cutters whose PCD table comprises inter-bonded diamond grains, and substantially free or a reduced amount of catalytic materials such as cobalt in the leached volume that are leached out. A leaching process may be either a chemical or an electrochemical process. A caustic material such as acids or bases may be used as a leaching agent. U.S. Pat. No. 4,224,380 A discloses a leaching process using a chemical method. A leached PDC cutter usually contains substantially free or a reduced amount of catalytic materials only around the surface and subsurface layer of its PCD table, since a completely leached PCD is very brittle. U.S. Pat. Nos. 6,592,985 B2 and 6,878,447 B2 disclose partially leached PCD, which are herein incorporated by reference in their entirety. Leaching can be performed on a PCD table of a PDC cutter after HTHP processing. Alternatively, leaching also can be conducted on an unbacked PCD table, and then, the leached PCD table is bonded to a cemented carbide substrate by re-pressing under HTHP, forming an integral PDC cutter.

Usually, a partial leaching process may remove catalyst materials from partial or entire exterior surface and subsurface layer of a PCD table with a limited depth. A leaching depth is generally tens to hundreds of micrometers from the exterior surfaces of a PCD.

Figure 1B:
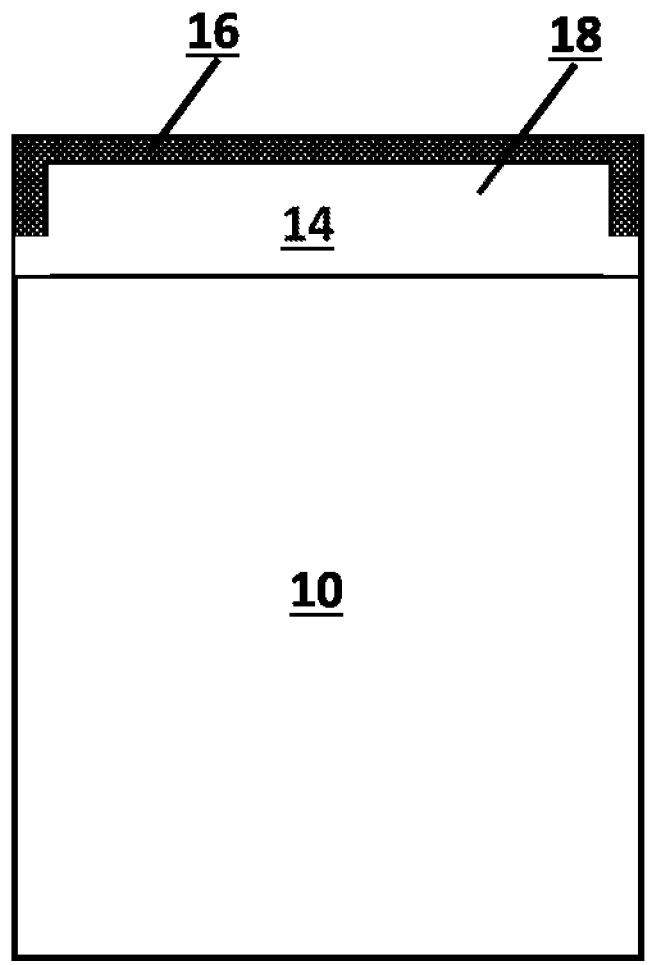
FIG. 1B is a schematic illustration of a cross sectional view of a cylindrical, partially leached PDC cutter comprising a PCD table and a cemented carbide body substrate.

FIG. 1B schematically shows a cross sectional view of a leached PDC cutter. The leached PDC cutter consists of a cemented carbide body 10 as a supporting substrate and a partially leached PCD table 14 as a cutting element. The partially leached PCD table 14 consists of a leached volume 16 and an unleached volume 18. The leached volume 16 consists of inter-bonded diamond grains and interstitial pores among the inter-bonded diamond grains, while the unleached volume 18 consists of inter-bonded diamond grains and catalyst materials disposed in interstitial space among the inter-bonded diamond grains as a cutting element, such as those discussed above. As shown in FIG. 1B, leaching is performed only at a portion of exterior surface and subsurface layer, while the exterior surface adjacent to interface between the PCD table and the cemented carbide substrate keeps intact. In embodiments of the disclosure, a leached PDC cutter refers to a PDC cutter having a leached PCD table which is leached partially or completely.

According to this disclosure, the cemented carbide body substrate of a PDC cutter is usually referred to as sintered tungsten carbide compacts, i.e., the composite materials of tungsten carbide particles and metal/alloy binders such as iron, nickel, cobalt, or their alloys. The sintered tungsten carbide compacts are either straight grade sintered tungsten carbide composites in which tungsten carbide is the sole carbide constituent, or those straight grades combined with varying proportions of other carbides such as titanium carbide (TiC), tantalum carbide (TaC), niobium carbide (NbC), etc.

Embodiments of the disclosure relate to a PDC cutter having a protective barrier coating. The PDC cutter consists of an unleached or leached PCD table and a cemented carbide body, as mentioned previously. The coating covers at least a portion of the exterior surfaces of the PCD table of the PDC cutter, and it may also extend over partially or entirely the exterior surfaces of the cemented carbide body.

In an embodiment of this disclosure, an unleached or leached PDC cutter has a coating comprising a layer of a carbide-forming metal selected from titanium (Ti), niobium (Nb), zirconium (Zr), vanadium (V), tantalum (Ta), hafnium (Hf), chromium (Cr), tungsten (W), molybdenum (Mo), or the alloys containing at least one of these metals which is held in contact with the PDC cutter, and an oxidation-resistant layer which is disposed over the carbide-forming metal layer. The oxidation-resistant layer is either an oxidation- and wear-resistant compound or an oxidation-resistant metal/alloy. The oxidation- and wear-resistant compound is selected from carbides, nitrides, borides, oxides, or their complex compounds. The oxidation-resistant metal/alloy is selected from nickel (Ni), iron (Fe), cobalt (Co), titanium (Ti), niobium (Nb), zirconium (Zr), vanadium (V), tantalum (Ta), hafnium (Hf), chromium (Cr), tungsten (W), molybdenum (Mo), manganese (Mn), silver (Ag), copper (Cu), gold (Au), platinum (Pt), palladium (Pd), or the alloys containing at least one of these metals. Alternatively, the coating may comprise both the oxidation- and wear-resistant compound and the oxidation-resistant metal/alloy layers, forming a multilayer coating.

According to the disclosure, the selection of the carbide-forming metal or alloy as a bonding layer is in that it can form a carbide at the interface between the coating and the PDC cutter, generating a strong metallurgical bonding. Like intrinsic properties of a coating, its bonding adhesion to a substrate is also very important. A strong metallurgical bonding at an interface can avoid flaking, chipping, peeling-off of the coating, guaranteeing an effective protection for the substrate material for a prolonged time. A carbide-forming metal is an ideal candidate material as a bonding layer of a coating on a carbon or carbon-containing material such as diamond, as it may form a carbide with the carbon or carbon-containing material substrate, generating a strongest metallurgical bonding. Besides the formation of a carbide, the embodiment of this disclosure also includes formation of a carbonitride at an interface between a PDC cutter and a carbide forming metal coating. The formation of the carbide at the interface between a carbide-forming metal coating and a PCD table of a PDC cutter results from a reaction between the carbide-forming metal elements in the coating and carbon atoms in the PCD table at elevated temperatures. Such the reaction can occur during deposition processes, additional heat treatments, subsequent brazing operations when joining a PDC cutter to a cutting tool body, and even cutting applications where significant heat is generated. A structure configuration around an interface between a PCD table and a carbide-forming metal coating would be the PCD table as a substrate/a resulting carbide product at the interface/the metal coating. Below are several typical examples. For titanium coating: the structure configuration around an interface is PCD table/TiC/Ti coating; for chromium coating: PCD table/$Cr_3C_2$/$Cr_7C_3$/Cr coating; for tungsten coating: PCD table/WC/$W_2$C/W coating; and for molybdenum coating: PCD table/MoC/$Mo_2$C/Mo coating. A formed carbide at an interface may be discretely distributed particles or a continuous layer, depending on temperatures and times. If a carbide-forming metal coating extends over a cemented carbide body substrate of a PDC cutter, a similar interface structure can be developed where the cemented carbide body may provide carbon atoms for the formation of a carbide. The formation of the carbide can guarantee a strong metallurgical bonding between a coating and a PDC cutter, which may prevent the coating from flaking and peeling-off due to thermal and mechanical attacks during brazing operations and cutting applications.

According to this disclosure, a heat treatment may be employed to form a carbide at the interface between the coating and the PDC cutter. The heat treatment is conducted in a vacuum, inert or reducing atmosphere furnace at 450° C.-900° C. for 1 minute to 120 minutes. Although a carbide could form at an even higher temperature, the integrity of a PDC cutter would be damaged, as diamond may convert back to graphite in the presence of a catalyst material, and the collapse of diamond-diamond bonds and debonding between a PCD table and a cemented carbide substrate may occur due to substantial difference in thermal expansion coefficient between the diamond and the catalyst material, and between the PCD table and the cemented carbide substrate. The heat treatment can be performed either after depositing whole coating layers or just after depositing a carbide-forming metal/alloy layer. If a deposition temperature falls into the range of carbide formation and the deposition lasts for a sufficient time, a carbide would form during the deposition process. That is an ideal process for the inventive coating.

Figure 2A:
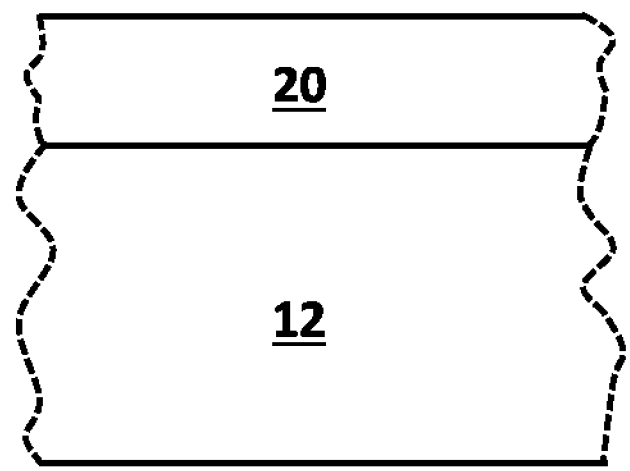
FIG. 2A is a schematic illustration of a cross sectional view of an interface between a PCD table and a carbide-forming metal coating where the metal is just absorptive or mechanically interlocked on the PCD table, and there exist no interdiffusion and formation of a carbide compound.
Figure 2B:
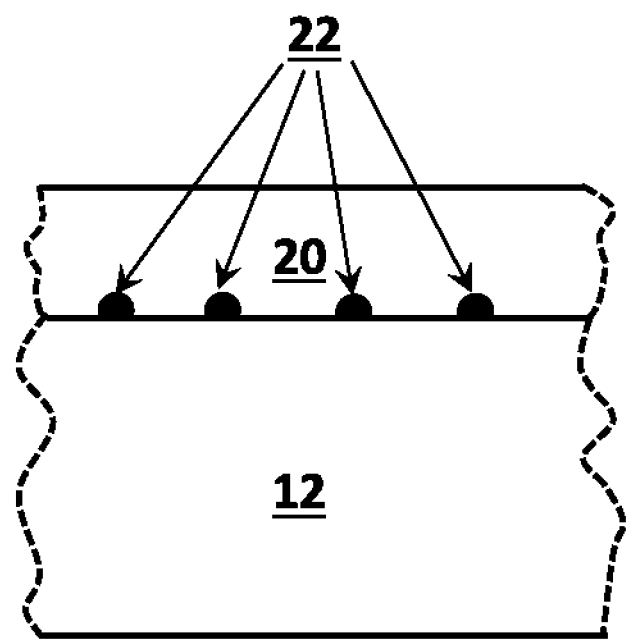
FIG. 2B is a schematic illustration of a cross sectional view of an interface between a PCD table and a carbide-forming metal coating where carbide particles form and a metallurgical bonding is developed.
Figure 2C:
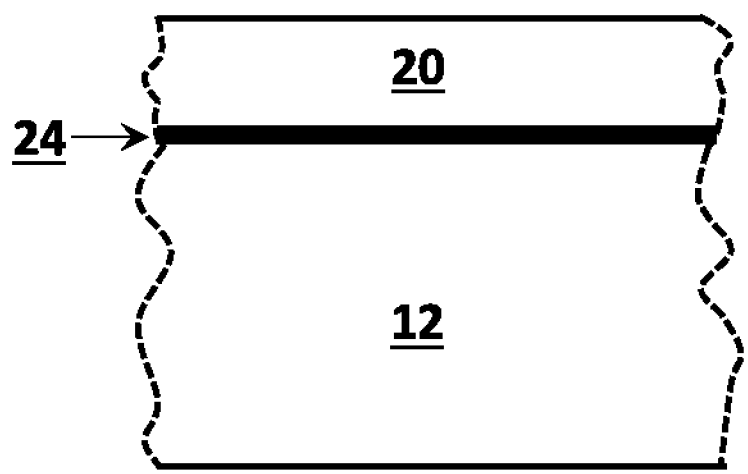
FIG. 2C is a schematic illustration of a cross sectional view of an interface between a PCD table and a carbide-forming metal coating where a carbide layer forms and a metallurgical bonding is developed.

FIG. 2 schematically depicts a cross sectional view of a structure at an interface between a PCD table and a carbide-forming metal coating. As shown in FIG. 2A, a carbide-forming metal layer 20 is deposited on a PCD table 12. The carbide-forming metal layer 20 is just adsorptive or mechanically interlocked on the PCD table 12, and there exist no interdiffusion or formation of any carbide at the interface. FIGS. 2B and 2C show formation of a carbide at the interface, where a metallurgical bonding is developed. As shown in FIGS. 2B and 2C, discretely-distributed carbide particles 22 and a continuous, thin layer of carbide 24 form, respectively. In the illustrations, the substrate 12 is an unleached PCD table. Similarly, the substrate may be either a leached PCD table or a cemented carbide body, and the formation of a carbide occurs at the interface. The illustrations are not drawn to proportional scale, and only idealized representations to describe the embodiments of this disclosure.

Embodiments of the disclosure relate to a PDC cutter having a protective barrier coating comprising an oxidation- and wear-resistant compound layer, besides the bonding layer of the carbide-forming metals, as mentioned above. The compound is selected from carbides, nitrides, borides, oxides, or their complex compounds. It is preferred that the compound contains aluminum, chromium, or both, such as chromium nitride (CrN), aluminum chromium nitride (AlCrN), aluminum titanium nitride (AlTiN), aluminum titanium silicon nitride (AlTiSiN), titanium aluminum chromium yttrium nitride (TiAlCrYN), etc., as these compounds can form continuous, dense, defect-free oxides when exposed to an oxygen-containing environment at elevated temperatures, which can protect underneath materials from being oxidized. The compounds, especially the complex compounds containing more than two elements, may not be stoichiometric. The compounds have good thermal stability and high hardness, thus, resulting in a good combination of excellent oxidation and wear resistance. They can act as an effective barrier layer to protect a PDC cutter from thermal and mechanical attacks during brazing operations and cutting applications. Alternatively, an outer layer of a metal or alloy may be applied over the oxidation- and wear-resistant compound layer.

Embodiments of the disclosure relate to a PDC cutter having a protective barrier coating comprising an oxidation-resistant metal/alloy layer, besides the bonding layer of the carbide-forming metal/alloy, as mentioned above. The metal/alloy coating is oxidation resistant and brazable. Therefore, it would protect PDC cutters from being oxidized and to improve brazing capability of a PDC cutter, as both a PCD table and a cemented carbide substrate are notorious for their brazing capability. A compound coating would worsen their brazing capability, as the compound coating usually has a poor wettability with a brazing material. The oxidation-resistant metal/alloy layer may also be applied over a compound coating layer forming a multilayer coating. The metal or alloy for coating is preferentially selected from Ni, Fe, Co, Ti, Nb, Zr, V, Ta, Hf, Cr, W, Mo, Mn, Ag, Cu, Au, Pt, Pd, or the alloys containing at least one of these metals, such as Ni—Cr alloys. Undoubtedly, the metal or alloy coating may protect the underneath coating and PDC cutters from being oxidized, improve brazing capability of a PDC cutter, and increase bonding strength between a PDC cutter and a tool body.

According to this disclosure, a total thickness of whole, completed coating is in a range of 0.4 µm-100 µm, preferentially 1 µm-20 µm.

According to this disclosure, a coating covers at least partially the exterior surfaces of a PCD table of a PDC cutter. Furthermore, the coating may expand partially or completely over a cemented carbide body substrate. An outer metal coating layer on brazing areas of a cemented carbide body substrate and even a PCD table would improve its bonding strength with a tool substrate, while a compound coating would be more effective in mitigating its oxidation damages during brazing operations and cutting applications as well.

In another embodiment of this disclosure, an unleached or leached PDC cutter has a coating comprising a layer of a compound selected from carbides, nitrides, borides, oxides, or their complex compounds which is held in contact with the PDC cutter. The coating has a metallurgical bonding with the PDC cutter. The compound consists of metallic elements and nonmetallic elements. The nonmetallic elements are selected from carbon (C), nitrogen (N), boron (B), and oxygen (O). The compound is preferentially nonstoichiometric and the quantity of the nonmetallic element atoms in the compound is less than stoichiometric value, so that free metal from the compound and carbon atoms from the surface of diamond and cemented carbide substrate can react to form a carbon-containing compound, generating a metallurgical bonding. For example, a nonstoichiometric carbide, $MC_{1-x}$ (M and C represent a carbide-forming metal element and carbon, respectively, $0<x<1$), is deficient in carbon. That is, the quantity of carbon atoms in it is less than stoichiometric value. Therefore, the free metal in it tends to react with carbon atoms from PDC cutter surface at an elevated temperature forming a stoichiometric carbide such as MC. Alternatively, an outermost coating layer of an oxidation-resistant metal or alloy may be applied which is selected from Ni, Fe, Co, Ti, Nb, Zr, V, Ta, Hf, Cr, W, Mo, Mn, Ag, Cu, Au, Pt, Pd, or the alloys containing at least one of these metals. The metal/alloy outermost layer not only provides additional anti-oxidation protection for cutters, but also improves brazability of the cutters.

According to the disclosure, the coating may have a metallurgical bonding, i.e., formation of a compound containing carbon from a PDC cutter, at the interface between the coating and the PDC cutter. The carbide-forming metal or alloy layer as a base layer facilitates such the formation of metallurgical bonding. However, a compound layer, especially one with less than stoichiometric value of nonmetallic elements, may also form a metallurgical bonding. The metallurgical bonding is generated by a chemical reaction between coating and PDC cutter. Such the reaction may occur during deposition processes, additional heat treatments, or subsequent brazing operations when joining the PDC cutter to a cutting tool body.

According to this disclosure, a heat treatment is employed to form a metallurgical bonding, i.e. a compound containing carbon from a PDC cutter, at interface between the coating and the PDC cutter. The heat treatment is conducted in a vacuum, inert or reducing atmosphere furnace at 450° C.-900° C. for 1 minute to 120 minutes. The heat treatment can be performed after depositing the whole coating layers or just after depositing a base coating in case of a multilayer coating.

Figure 3:
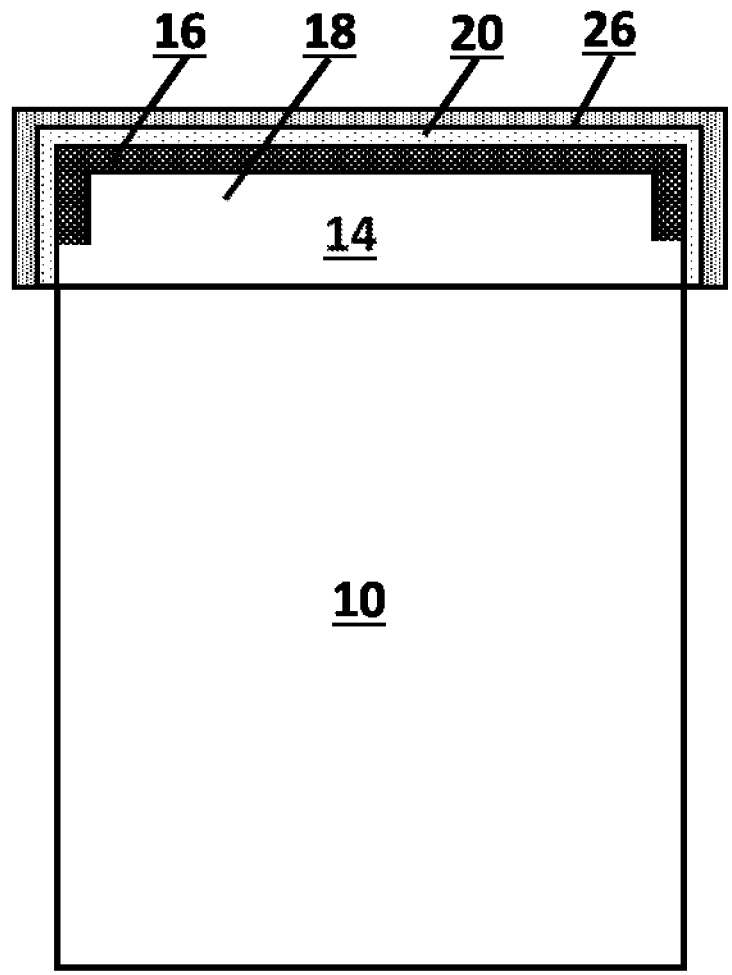
FIG. 3 is a schematic illustration of a cross sectional view of a cylindrical PDC cutter having a two-layer coating covering all the exterior surfaces of the PCD table, which comprises an inner layer of a carbide-forming metal, and an outer layer of an oxidation- and wear-resistant compound.

According to this disclosure, an unleached PDC cutter and a leached PDC cutter have the same coating configuration. In order to simplify illustrative descriptions, in FIGS. 3-9, the coating configurations on a partially leached PDC cutter are depicted, which are also applied to an unleached PDC cutter. Referring to FIG. 3, an embodiment of a PDC cutter having a two-layer coating over its PCD table in accordance with the present disclosure is shown. FIG. 3 schematically shows a cross sectional view of a partially leached PDC cutter having a two-layer coating. As shown, the partially leached PCD table 14 consists of a leached volume 16 and an unleached volume 18. The partially leached PCD table 14 has a two-layer coating including a carbide-forming metal coating 20 as a bonding layer, and an oxidation- and wear-resistant compound coating 26 over its exterior surfaces. The cemented carbide body 10 is the substrate of the partially leached PCD table 14. It should be apparent that the layer illustrated in FIG. 3 is exaggerated in thickness for purposes of illustration and in practice it is extremely thin. The similar illustrations are also in FIGS. 4-9.

Figure 4:
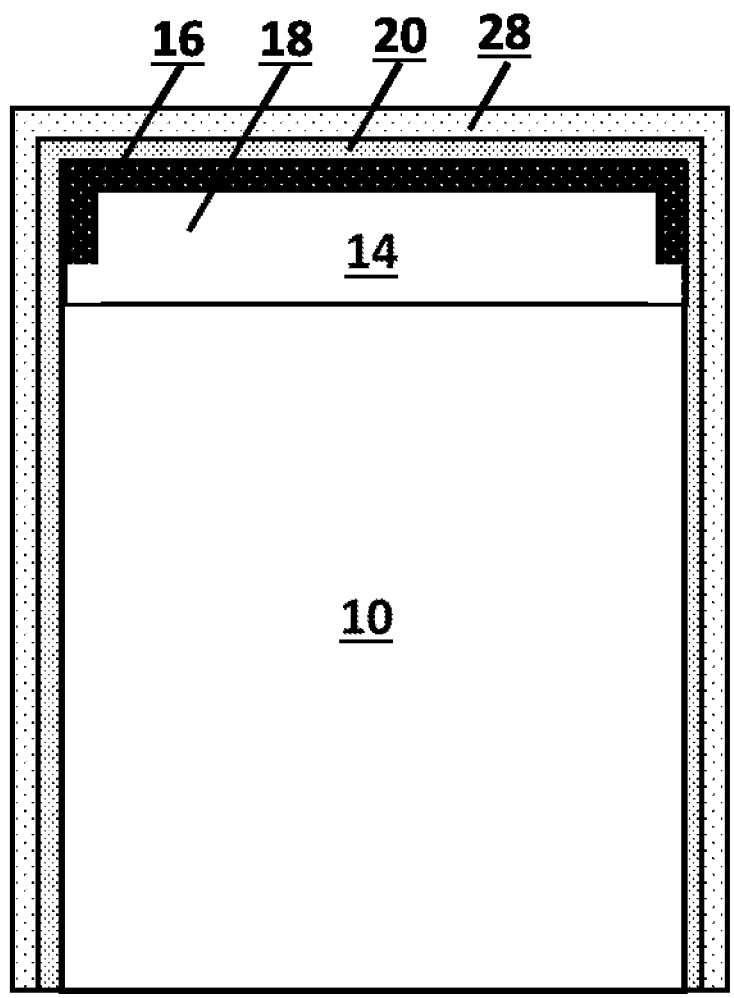
FIG. 4 is a schematic illustration of a cross sectional view of a cylindrical PDC cutter having a two-layer coating covering all the exterior surfaces of the PCD table, and a part of the exterior surfaces of the cemented carbide body substrate, which comprises an inner layer of a carbide-forming metal, and an outer layer of an oxidation-resistant metal.

Referring to FIG. 4, another embodiment of a PDC cutter having a two-layer coating over its PCD table and cemented carbide body in accordance with the present disclosure is shown. FIG. 4 schematically shows a cross sectional view of a leached PDC cutter having a two-layer coating. As shown, the partially leached PCD table 14 consists of a leached volume 16 and an unleached volume 18. The exterior surfaces of the leached PCD table 14 and the side surfaces of the cemented carbide body 10 have a two-layer coating including a carbide-forming metal/alloy coating 20 as a bonding layer, and an oxidation-resistant metal/alloy coating 28 as an outer layer over its exterior surfaces. The cemented carbide body 10 is the substrate of the leached PCD table 14.

Figure 5:
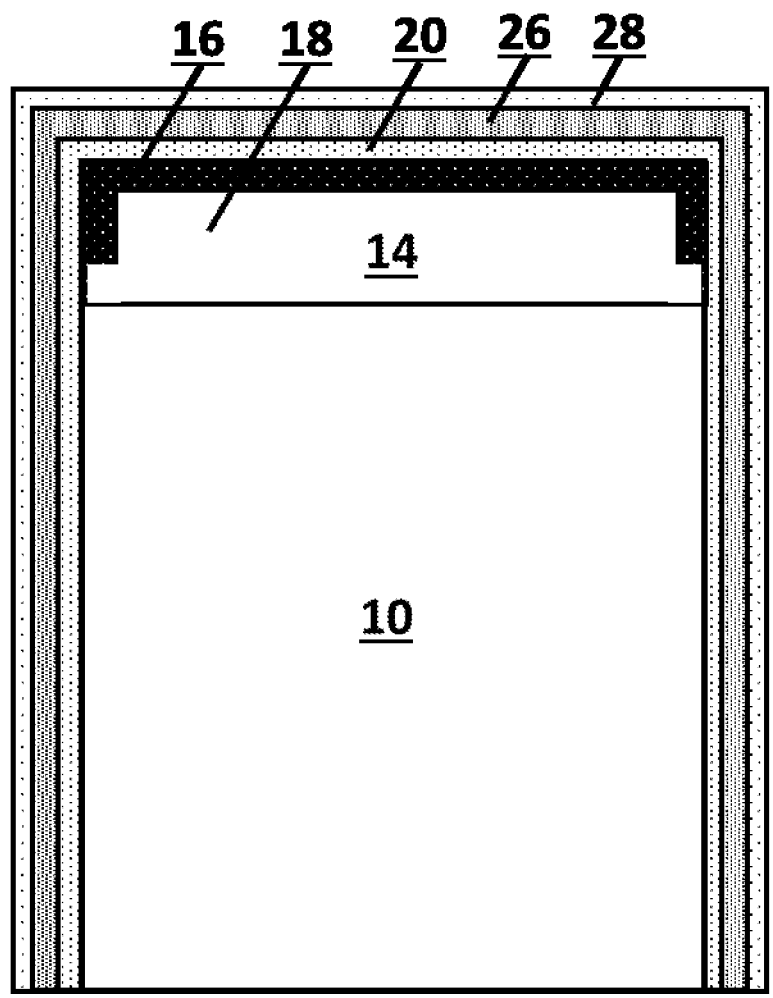
FIG. 5 is a schematic illustration of a cross sectional view of a cylindrical PDC cutter having a three-layer coating over all the exterior surfaces of the PCD table and a part of the exterior surfaces of the cemented carbide body substrate, which comprises an inner layer of a carbide-forming metal, an intermediate layer of an oxidation- and wear-resistant compound, and an outer layer of a metal.

Referring to FIG. 5, another embodiment of a PDC cutter having a three-layer coating over its PCD table and cemented carbide body in accordance with the present disclosure is shown. FIG. 5 schematically shows a cross sectional view of a leached PDC cutter having a three-layer coating. As is shown, the partially leached PCD table 14 consists of a leached volume 16 and an unleached volume 18. The exterior surfaces of the leached PCD table 14 and the side surfaces of the cemented carbide body 10 have a three-layer coating including a carbide-forming metal/alloy coating 20 as a bonding layer, an oxidation- and wear-resistant compound coating 26 as an intermediate layer, and an oxidation-resistant metal/alloy coating 28 as an outer layer.

Figure 6:
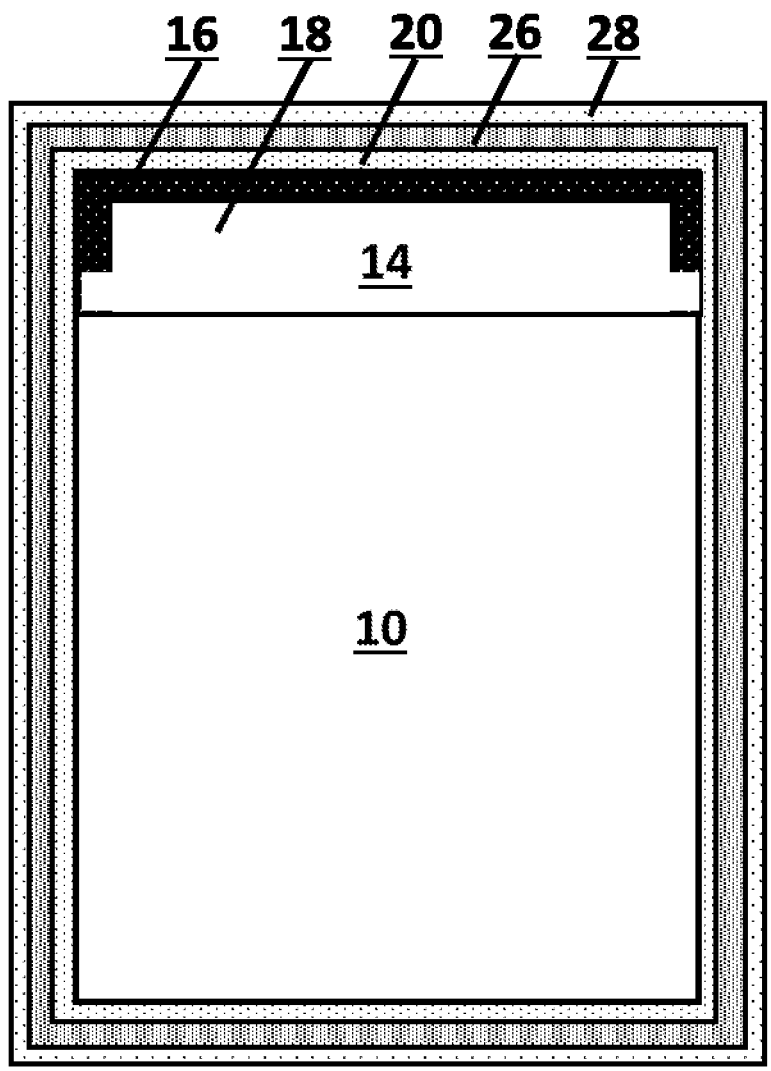
FIG. 6 is a schematic illustration of a cross sectional view of a cylindrical PDC cutter having a three-layer coating over all the exterior surfaces of the PCD table and the cemented carbide body substrate, which comprises an inner layer of a carbide-forming metal, an intermediate layer of an oxidation- and wear-resistant compound, and an outer layer of a metal.

Referring to FIG. 6, another embodiment of a PDC cutter having a three-layer coating over its PCD table and cemented carbide body in accordance with the present disclosure is shown. FIG. 6 schematically shows a cross sectional view of a leached PDC cutter having a three-layer coating. As is shown, the partially leached PCD table 14 consists of a leached volume 16 and an unleached volume 18. The whole exterior surfaces of the PDC cutter including the leached PCD table 14 and the cemented carbide body 10 have a three-layer coating including a carbide-forming metal/alloy coating 20 as a bonding layer, an oxidation- and wear-resistant compound coating 26 as an intermediate layer, and an oxidation-resistant metal/alloy coating 28 as an outer layer.

Figure 7:
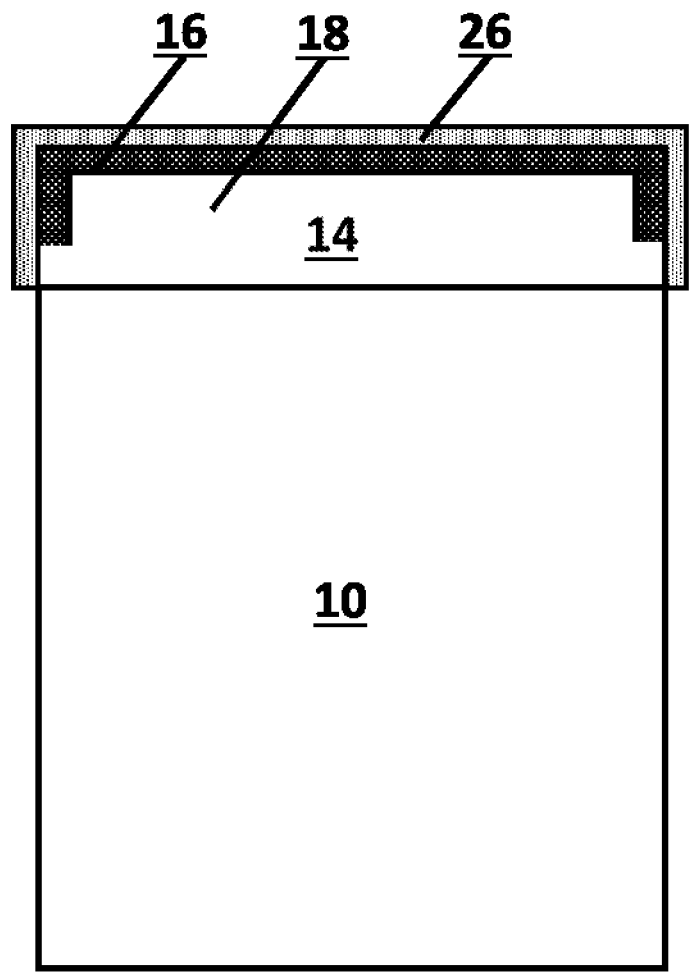
FIG. 7 is a schematic illustration of a cross sectional view of a cylindrical PDC cutter having a single-layer coating covering all the exterior surfaces of the PCD table, which comprises an oxidation- and wear-resistant compound, having a metallurgical bonding with the PCD table.

Referring to FIG. 7, an embodiment of a PDC cutter having an oxidation- and wear-resistant compound coating over its PCD table which has a metallurgical bonding in accordance with the present disclosure is shown. FIG. 7 schematically shows a cross sectional view of a partially leached PDC cutter having an oxidation- and wear-resistant compound coating. As shown, the partially leached PCD table 14 consists of a leached volume 16 and an unleached volume 18. The partially leached PCD table 14 has an oxidation- and wear-resistant compound coating 26 over its exterior surfaces, which has a metallurgical bonding with the PDC cutter. The cemented carbide body 10 is the substrate of the partially leached PCD table 14.

Figure 8:
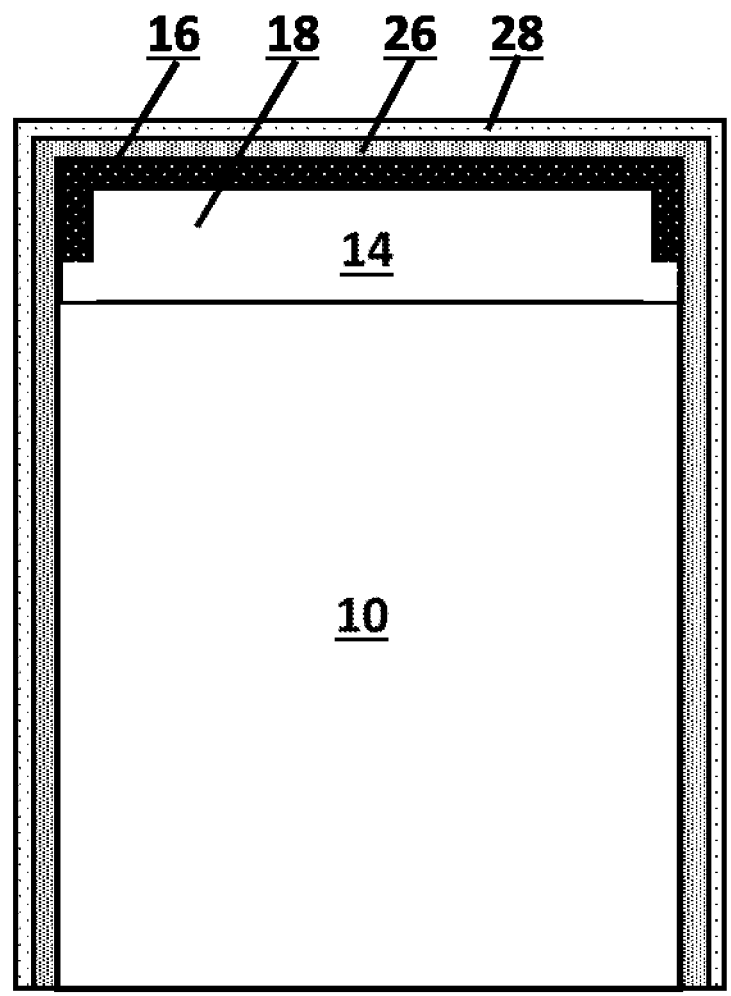
FIG. 8 is a schematic illustration of a cross sectional view of a cylindrical PDC cutter having a two-layer coating over all the exterior surfaces of the PCD table and a part of the exterior surfaces of the cemented carbide body substrate, which comprises an inner layer of an oxidation- and wear-resistant compound and an outer layer of a metal, having a metallurgical bonding with the PDC cutter.

Referring to FIG. 8, another embodiment of a PDC cutter having a two-layer coating over its PCD table and cemented carbide body which has a metallurgical bonding in accordance with the present disclosure is shown. FIG. 8 schematically shows a cross sectional view of a partially leached PDC cutter having a two-layer coating. As is shown, the partially leached PCD table 14 consists of a leached volume 16 and an unleached volume 18. The exterior surfaces of the partially leached PCD table 14 and the side surfaces of the cemented carbide body 10 have a two-layer coating including an oxidation- and wear-resistant compound coating 26 as an inner layer, and an oxidation-resistant metal/alloy coating 28 as an outer layer, which has a metallurgical bonding with the PDC cutter. The cemented carbide body 10 is the substrate of the partially leached PCD table 14.

Figure 9:
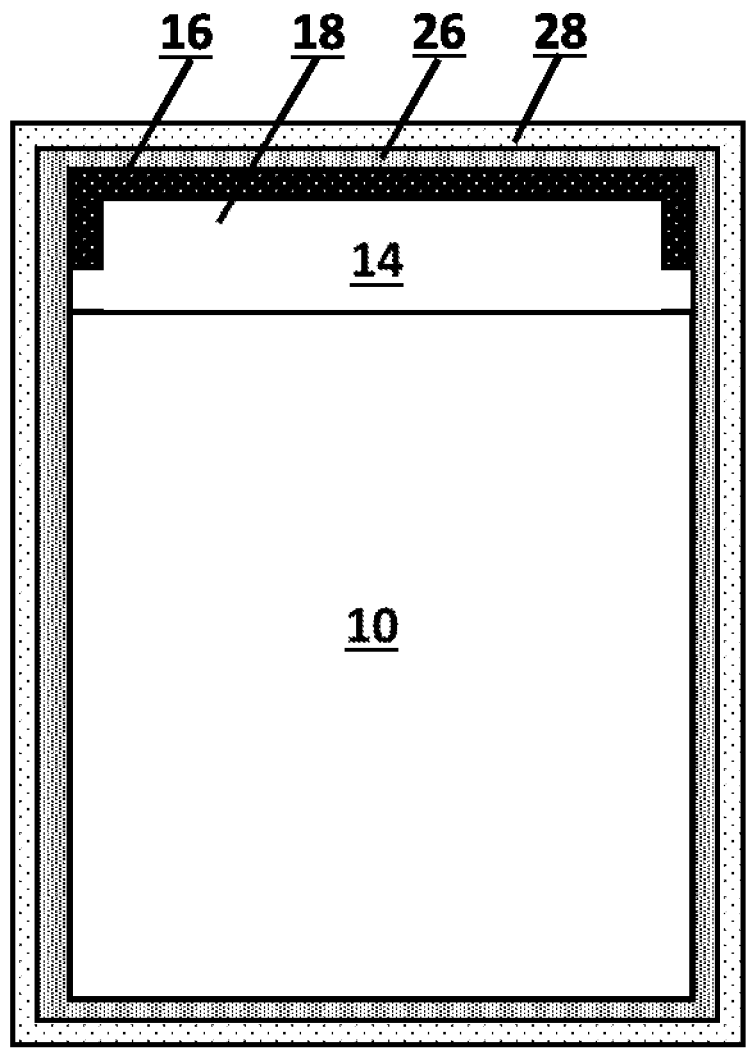
FIG. 9 is a schematic illustration of a cross sectional view of a cylindrical PDC cutter having a two-layer coating over all the exterior surfaces of the PCD table and the cemented carbide body substrate, which comprises an inner layer of an oxidation- and wear-resistant compound, and an outer layer of a metal, having a metallurgical bonding with the PDC cutter.

Referring to FIG. 9, another embodiment of a PDC cutter having a two-layer coating over its PCD table and cemented carbide body which has a metallurgical bonding in accordance with the present disclosure is shown. FIG. 9 schematically shows a cross sectional view of a partially leached PDC cutter having a two-layer coating. As is shown, the partially leached PCD table 14 consists of a leached volume 16 and an unleached volume 18. The whole exterior surfaces of the PDC cutter including the partially leached PCD table 14 and the cemented carbide body 10 have a two-layer coating including an oxidation- and wear-resistant compound coating 26 as an inner layer, and an oxidation-resistant metal/alloy coating 28 as an outer layer, which has a metallurgical bonding with the PDC cutter. The cemented carbide body 10 is the substrate of the partially leached PCD table 14.

According to this disclosure, a coating may cover the exterior surfaces of a PDC cutter partially or completely. Furthermore, the PDC cutter may have various kinds of coatings at various locations. For example, a PCD table of a PDC cutter has a two-layer coating and its cemented carbide substrate has a single-layer metal coating, or a three-layer metal-compound-metal coating.

According to this disclosure, PDC cutters may have various geometric shapes including symmetrical and non-symmetrical shapes, such as cylinders, cones, cubes, cuboids, chisel, etc.

According to the disclosure, coating processes can be one of PVD, CVD, TD, electrolytic plating, electroless plating, other deposition methods, or their combinations.

PVD includes thermal evaporation, sputtering, and ion plating. It is conducted at a relatively low temperature, usually below 500° C. It is an ideal deposition method for coating PDC cutters. It is cost saving and suitable for mass production.

In an embodiment of this disclosure, PVD is used to coat leached PDC cutters with a metal/alloy, a compound, or both. The metal/alloy is selected from Ti, Nb, Zr, V, Ta, Hf, Cr, W, Mo, Ni, Fe, Co, Mn, Ag, Cu, Au, Pt, Pd, or the alloys containing any of these metals. The compound is selected from carbides, nitrides, borides, oxides, or their complex compounds. The compound layer preferentially comprises a compound containing aluminum, chromium, or both, such as CrN, AlTiN, AlCrN, AlTiSiN, TiAlCrYN, etc. A coating thickness is in a range of 0.4 µm-100 µm, preferentially 1-20 µm.

CVD technique utilizes a high-temperature process, up to 1000° C. However, PDC cutters have risk of thermal degradation above 700° C. Therefore, processing parameters must be selected carefully, so as to avoid any thermal damages to a PDC cutter during the deposition processes, as its PCD table and cemented carbide substrate have significant difference in thermal expansion coefficients. One of advantages is that a metallurgical bonding may form during a CVD process.

TD techniques include salt bath immersion and pack cementation methods. They are conducted at high temperatures between 500° C. and 1250° C. Likely, processing parameters must be selected carefully when processing temperature is over 700° C., so as to avoid any thermal damages to a PDC cutter during the deposition processes. A metallurgical bonding may form during a TD process.

Electrolytic plating and electroless plating are performed in an electrolyte solution at a temperature less than 100° C. They are used to coat a metallic layer. A part to be plated must be an electric conductor. Therefore, Electrolytic plating and electroless plating could not be applied directly to a PDC cutter, as a PCD table of a PDC cutter is not electrically conductive. The plating methods are only suitable to coat a PDC with a prior coated layer. That is, electrolytic plating or electroless plating is used to form a metallic coating layer over a prior coating on a PDC cutter.

Examples are provided below to illustrate the working of the embodiments, but such the examples are by no means considered restrictive.

Figure 10:
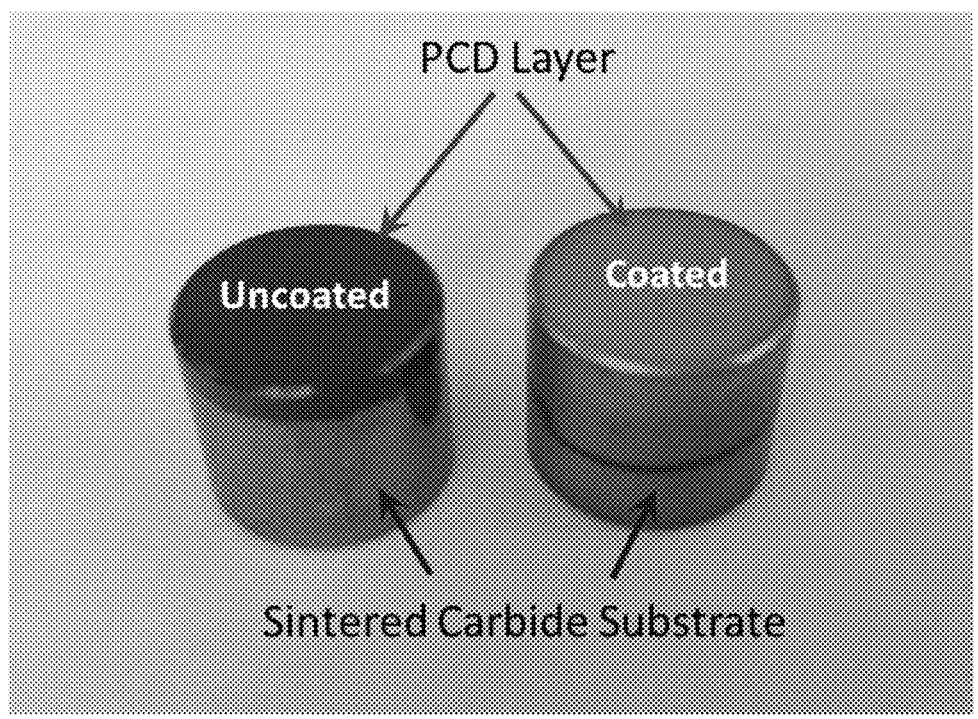
FIG. 10 is a photograph showing an uncoated and a coated 1613 PDC cutter with a nominal size of 16 mm in diameter and 13 mm in height that are prepared using HTHP. The coating on the coated cutter has three layers of Cr as a bonding layer, AlTiN compound as an oxidation- and wear-resistant intermediate layer, and Cr as an oxidation-resistant, brazable, outer layer. The coated PDC cutter experienced heat treatment after coating.

Example 1: Coating a PDC Cutter with Three Layer of Cr, AlTiN, and Cr by PVD—Ion Plating One cylindrical 1613 PDC cutter with a nominal size of 16 mm in diameter and 13 mm in height was used for experiment, as shown in FIG. 10. The PDC cutter consists of an unleached PCD table of 2 mm in height and a sintered tungsten carbide body of 11 mm in height as a substrate. The PDC cutter was subjected to ion plating processing to deposit Cr and AlTiN over all the exterior surfaces of the PCD table and the side surfaces of the sintered tungsten carbide body. Ion plating is one of PVD processes that is also referred to as ion assisted deposition. The PDC cutter was rinsed ultrasonically in acetone, dried, and then put into a chamber of an ion plating machine. There are two kinds of targets in the chamber. One is Cr, and the other is an AlTi alloy. First, a bonding layer Cr was deposited onto the PDC cutter by burning the Cr target by trigger. A partial pressure of Ar was kept at 0.5 Pa. The deposition temperature is around 450° C. and the deposition time is 30 min. The Cr coating thickness is about 1 µm. The PDC cutter with the Cr coating was further coated with AlTiN by burning the AlTi alloy target. At this time, nitrogen gas was introduced into the chamber by a mass flow meter. The deposition temperature is around 450° C. and the deposition time is 1.5 hours. The coating thickness of AlTiN is about 4 µm. Finally, an outer layer Cr was deposited onto the AlTiN layer by burning the Cr target by trigger. A partial pressure of Ar was kept at 0.5 Pa. The deposition temperature is around 450° C. and the deposition time is 30 min. The outer layer of Cr has a thickness of about 1 µm. The coating on the PDC cutter has three layers. The inner coating layer is the Cr bonding layer, the intermediate layer is the oxidation- and wear-resistant layer of AlTiN compound, and the outer layer is the Cr layer. The coatings are continuous, dense, and crack free.

Example 2: Heat Treatment of Coated PDC Cutter

The PDC cutter with the three-layer coating of example 1 was subject to heat treatment. The heat treatment was performed in an electric resistance furnace under flowing Ar. The heating rate is 10° C./min. The predetermined holding temperature is 630° C. and the predetermined holding time is 1 hour. The PDC cutter was cooled in the furnace by turning off the power while keeping Ar flowing. The heat treatment is to achieve a metallurgical bonding between the PCD table of the PDC cutter and the coating layers. FIG. 10 shows an as-received PDC cutter and the PDC cutter with the three-layer coating and subjected to the heat treatment. The coating is continuous, dense, and crack free. The coating would isolate the PDC cutter, especially the PCD table, from oxygen in atmosphere during brazing operations and cutting applications. It would protect the PCD table from thermal degradations such as oxidation and graphitization of diamond.

According to this disclosure, the PDC cutters with the protective barrier coatings are mounted to a cutting tool body as cutting elements, such as drilling bits, mill bits, reamers, etc. The joining methods include mechanical securing methods or brazing operations. Although the mechanical securing methods may eliminate thermal attacks during joining, the PCD tables of PDC cutters still encounter risk of thermal degradation during cutting services where high temperatures are generated.

According to this disclosure, the PDC cutters with the protective barrier coatings comprising an oxidation- and wear-resistant compound layer would bring up additional benefits for mill bits, such as improving cutting performance and efficiency. Such the mill bits with the coated PDC cutters can mill steel casing tubes and cut the formation in one trip. As well known, diamond including polycrystalline diamond is not suitable for cutting iron and steel, as diamond would react with the iron and steel during cutting, resulting in its premature failure. The disclosed coating on the PDC cutters is superior to a PCD table in milling a steel.

According to this disclosure, the selected barrier coatings on PDC cutters are a protective coating. The coatings can prevent the PDC cutters, especially the PCD tables, from oxidation and degradation during brazing operations and cutting applications where high temperatures are generated, such as graphitization of diamond.

Advantageously, embodiments of the present disclosure provide a PDC cutter with a protective barrier coating with an excellent oxidation and wear resistance. The formation of the coating is through one or their combinations of PVD, CVD, TD, electrolytic plating, electroless plating, or any other deposition methods. The coating would mitigate thermal and mechanical damages of the PDC cutter, especially PCD table during brazing operations and cutting applications, and enhance bonding strength if an outer metallic coating is applied. The processing methods are convenient, cost-effective, and suitable for mass production.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiments, methods, and examples, but by all embodiments and methods within the scope and spirit of the invention as claimed.

The invention claimed is:

1. A polycrystalline diamond compact cutter comprising:
    a cemented carbide body as a supporting substrate;
    an unleached or leached polycrystalline diamond table as a cutting element which is disposed on the supporting substrate; and
    a coating covering at least a portion of the exterior surfaces of the polycrystalline diamond table, wherein the coating consists of a layer of a carbide-forming metal selected from Ti, Nb, Zr, V, Ta, Hf, Cr, W, Mo, or the alloys containing any of these metals which is held in contact with the polycrystalline diamond compact cutter, and an oxidation-resistant layer which is disposed on the carbide-forming metal layer.

2. The polycrystalline diamond compact cutter as defined in claim 1, wherein the oxidation-resistant layer comprises a layer of a compound selected from carbides, nitrides, borides, oxides, or their complex compounds.

3. The polycrystalline diamond compact cutter as defined in claim 2, wherein the compound in the oxidation-resistant compound layer contains aluminum, chromium, or both.

4. The polycrystalline diamond compact cutter as defined in claim 3, wherein the compound containing aluminum, chromium, or both comprises AlN, CrN, AlTiN, AlCrN, AlTiSiN, or TiAlCrYN.

5. The polycrystalline diamond compact cutter as defined in claim 1, wherein the oxidation-resistant layer comprises a layer of a metal selected from Ni, Fe, Co, Ti, Nb, Zr, V, Ta, Hf, Cr, W, Mo, Mn, Ag, Cu, Au, Pt, Pd, or the alloys containing any of these metals.

6. The polycrystalline diamond compact cutter as defined in claim 1, wherein a metallurgical bonding between the coating and the polycrystalline diamond compact cutter, that is, formation of a carbide, is developed during either deposition processes, heat treatments, or brazing operations when mounted (brazed) onto a tool.

7. The polycrystalline diamond compact cutter as defined in claim 6, wherein the heat treatments are performed at between 450° C. and 900° C. for 1 minute-120 minutes.

8. The polycrystalline diamond compact cutter as defined in claim 1, wherein the coating may extend over partially or entirely the exterior surfaces of the cemented carbide body.

9. The polycrystalline diamond compact cutter as defined in claim 1, wherein a thickness of the coating is in a range of 0.4 μm-100 μm, preferentially 1-20 μm.

10. Methods of making the polycrystalline diamond compact cutter with the protective barrier coating according to claim 1, comprising physical vapor deposition, chemical vapor deposition, thermoreactive deposition and diffusion, electrolytic plating, electroless plating, or their combinations.

11. A polycrystalline diamond compact cutter comprising:
a cemented carbide body as a supporting substrate;
an unleached or leached polycrystalline diamond table as a cutting element which is disposed on the supporting substrate; and
a coating covering at least a portion of the exterior surfaces of the polycrystalline diamond table, wherein the coating comprises an oxidation-resistant layer of a compound selected from carbides, nitrides, borides, oxides, or their complex compounds, and wherein the coating has a metallurgical bonding with the polycrystalline diamond table, which is characterized by formation of a compound containing carbon at their interface.

12. The polycrystalline diamond compact cutter as defined in claim 11, wherein the oxidation-resistant compound, comprising metallic elements and nonmetallic elements which are selected from C, N, B, and O, is non-stoichiometric and the quantity of the nonmetallic element atoms in the oxidation-resistant compound is less than stoichiometric value.

13. The polycrystalline diamond compact cutter as defined in claim 11, wherein the compound in the oxidation-resistant compound layer contains aluminum, chromium, or both.

14. The polycrystalline diamond compact cutter as defined in claim 11, wherein the metallurgical bonding between the coating and the polycrystalline diamond compact cutter, that is, formation of a compound containing carbon, is developed during either deposition processes, heat treatments, or brazing operations when mounted onto a tool.

15. The polycrystalline diamond compact cutter as defined in claim 14, wherein the heat treatments are conducted between 450° C. and 900° C. for 1 minute-120 minutes.

16. The polycrystalline diamond compact cutter as defined in claim 11, wherein the coating comprises a layer of a metal selected from Ni, Fe, Co, Ti, Nb, Zr, V, Ta, Hf, Cr, W, Mo, Mn, Ag, Cu, Au, Pt, Pd, or the alloys containing any of these metals which is disposed on the previously-deposited coating as an outer coating, forming a multilayer coating.

17. The polycrystalline diamond compact cutter as defined in claim 11, wherein a thickness of the coating is 0.4 μm-100 μm, preferentially 1-20 μm.

18. Methods of making the polycrystalline diamond compact cutter with the coating according to claim 11, comprising physical vapor deposition, chemical vapor deposition, thermoreactive deposition and diffusion, electrolytic plating, electroless plating, or their combinations.

19. A method of coating a polycrystalline diamond compact cutter with a protective barrier coating, comprising physical vapor deposition including thermal evaporation, sputtering, and ion plating; wherein the polycrystalline diamond compact cutter comprising:
a cemented carbide body as a supporting substrate;
a leached polycrystalline diamond table as a cutting element which is disposed on the supporting substrate; and
the protective barrier coating covering at least a portion of the exterior surfaces of the polycrystalline diamond table.

20. The polycrystalline diamond compact cutter as defined in claim 19, wherein the protective barrier coating comprises a layer of a compound selected from carbides, nitrides, borides, oxides, or their complex compounds, and preferentially a compound containing aluminum, chromium, or both.

* * * * *